United States Patent
Shieh et al.

(10) Patent No.: US 7,977,868 B2
(45) Date of Patent: Jul. 12, 2011

(54) ACTIVE MATRIX ORGANIC LIGHT EMITTING DEVICE WITH MO TFT BACKPLANE

(75) Inventors: Chan-Long Shieh, Paradise Valley, AZ (US); Gang Yu, Santa Barbara, CA (US)

(73) Assignee: Cbrite Inc., Goleta, CA (US)

( * ) Notice: Subject to any disclaimer, the term of this patent is extended or adjusted under 35 U.S.C. 154(b) by 237 days.

(21) Appl. No.: 12/178,209

(22) Filed: Jul. 23, 2008

(65) Prior Publication Data
US 2010/0019656 A1    Jan. 28, 2010

(51) Int. Cl.
*H01J 1/62* (2006.01)
*H01J 63/04* (2006.01)
*H01J 9/24* (2006.01)

(52) U.S. Cl. ........ 313/504; 313/483; 313/498; 313/500; 313/501; 313/503; 313/505; 313/506; 313/512; 445/24; 445/25; 445/23; 445/1

(58) Field of Classification Search .................. None
See application file for complete search history.

(56) References Cited

U.S. PATENT DOCUMENTS

| | | | | |
|---|---|---|---|---|
| 6,911,666 B2* | 6/2005 | Voutsas | | 257/40 |
| 7,026,658 B2* | 4/2006 | Park et al. | | 257/98 |
| 7,167,169 B2* | 1/2007 | Libsch et al. | | 345/211 |
| 7,420,322 B2* | 9/2008 | Takei et al. | | 313/500 |
| 7,649,311 B2* | 1/2010 | Park et al. | | 313/505 |
| 2003/0030385 A1* | 2/2003 | Toyama | | 315/291 |
| 2005/0269945 A1* | 12/2005 | Su | | 313/504 |
| 2007/0096636 A1* | 5/2007 | Park et al. | | 313/503 |
| 2008/0297042 A1* | 12/2008 | Ahn et al. | | 313/504 |

FOREIGN PATENT DOCUMENTS

KR    2003013700 A    *    2/2003

OTHER PUBLICATIONS

English machine translation of KR 2003-13700 (Han et al).*

* cited by examiner

*Primary Examiner* — Natalie K Walford
(74) *Attorney, Agent, or Firm* — Parsons & Goltry; Robert A. Parsons; Michael W. Goltry

(57) ABSTRACT

A full-color active matrix organic light emitting display including a transparent substrate, a color filter positioned on an upper surface of the substrate, a spacer layer formed on the upper surface of the color filter, a metal oxide thin film transistor backpanel formed on the spacer layer and defining an array of pixels, and an array of single color, organic light emitting devices formed on the backpanel and positioned to emit light downwardly through the backpanel, the spacer layer, the color filter, and the substrate in a full-color display.

22 Claims, 2 Drawing Sheets

ACTIVE MATRIX ORGANIC LIGHT EMITTING DEVICE WITH MO TFT BACKPLANE

FIELD OF THE INVENTION

This invention generally relates to an organic light emitting display with metal oxide TFTs and a color filter.

BACKGROUND OF THE INVENTION

There is a strong interest in organic light emitting displays (OLED) because of the properties of organic light emitting devices. Generally, these devices are of very low current, low power, and high emission characteristics. Further, organic light emitting devices can be produced to emit virtually any color so that color displays are possible. As is understood by those skilled in the art, a color display requires arrays of red-green-blue pixels. However, it is very difficult to fabricate organic light emitting devices in arrays of color pixels. At present the only practical method is to deposit the various layers of color material required by using a process known as 'shadow masking' or the use of a shadow mask to deposit the color layers. The major problem is that this shadow mask is very difficult to make and expensive. Secondly, this shadow mask can only be used for certain deposition cycles due to dimension deformation. Moreover, the shadow mask process has upper size limits that restrict the process to relatively small displays.

High information content color arrays use an active matrix type of pixel control and address system. Generally, because the controlling transistors are built into the array, thin film transistors (TFT) are used. In the prior art, poly-silicon is used for the switching and control transistors in active matrix OLED displays (AMOLED). However, poly-silicon requires relatively high temperatures to process, and, therefore, adjoining circuitry and substrates are severely limited. Also, the characteristics of transistors formed in poly-silicon can vary, even between adjacent devices in an array, because of the variation in crystal size and position. To better understand this problem, in a conduction area under a sub-micron gate each different transistor can include from one or two poly-silicon crystalline grains to several crystalline grains and the different number of crystals in the conduction area will produce different characteristics. The dimensions and their physical characteristics among different grains are also different. In addition, poly-silicon is light sensitive, i.e. its I-V characteristic is changed by exposure to visible light. Amorphous silicon is also light sensitive so that devices fabricated from either of these materials require a light shield or light shielding, which further complicates the manufacturing process and reduces the aperture ratio (the emitting area over the pitch area). Small aperture ratio, in turn, requires the OLED be driven harder for a targeting display brightness and, thus, sets higher demand to OLED operation lifetime.

Fundamentally, a pixel driver for an active matrix organic light emitting display includes two transistors and a storage capacitor. One transistor serves as a switch and the other transistor serves as a current regulator for the OLED. A storage capacitor is connected between the gate and the drain (or the source) of the current regulator transistor to memorize the voltage on the data line after the switching transistor is turned off. Also, the pixel driver is connected to three bus lines, a scan or select line, a data line, and a power line, which are coupled to peripheral control circuitry. However, in the prior art, or the present state of active matrix organic light emitting displays, the pixel driver described cannot effectively be achieved with sufficient performance and/or at low cost.

Low temperature poly-silicon (LTPS) and amorphous silicon (a-Si) have been used to construct pixel driver circuits for active matrix organic light emitting display backpanels. In this context, the term "backpanel" refers to any array of switching circuits, generally arranged in column and row form, and each pixel or pixel element having a pixel electrode (either transparent or reflective to the emitted light) connected to an organic light emitting diode. At the present time all of the active matrix organic light emitting displays in the commercial market are fabricated with LTPS backpanels. Although LTPS provides sufficient operating lifetime needed for driving OLEDs, the "mura" defect caused by TFT performance inhomogenity is much more serious for LTPS TFTs being used for driving OLEDs than for driving liquid crystal displays (LCDs). As a result, more than 2 transistors are often used in pixel drivers to compensate for the mura inhomogenity. Also, in some applications more than three bus lines (data, selection, and power) are included for compensation circuitry. Further, LTPS backpanels require larger storage capacitors due to relatively higher "OFF" current in the switching transistors. Although higher mobility in LTPS backpanels allows transistors with shorter width/length (W/L) ratio, the higher OFF-current in the switching transistors requires multiple gate design (e.g. top and bottom gate electrodes) and larger space between source and drain electrodes. Thus, the effective area needed for each pixel driver is substantial compared to the total pitch area. Thus, the OLED emitter has to be arranged or stacked with the pixel driver for light emission from the top. The small energy gap of LTPS also requires that LTPS TFTs are shielded from the light being emitted as well as from ambient light.

There has been significant effort to fabricate active matrix organic light emitting display backpanels using a-Si TFTs. However, the I-V (current-voltage) performance in a-Si TFTs is not stable under DC operation (Vth shift and mobility decrease due to defect density increase) so that it is hard to use a-Si TFTs for the driver or current regulator transistor in the backpanel. Pixel control circuits with more transistors, capacitors, and buslines have been proposed to stabilize the transistor performance but none of them have demonstrated the stability needed for commercial applications. The low carrier mobility (~0.1 to 0.7 $cm^2/Vsec$) also requires larger W/L ratio (and thus larger TFT size) for the driver or current regulator transistor. As a result, there is not sufficient room for an OLED emitted pad for a bottom emission so that a top emission configuration has to be used.

In the top emission active matrix organic light emitting display design, a planarization layer is needed to separate the TFT from the bottom electrode of the OLED emitter to eliminate optical and electrical crosstalk between the two portions. Two to three photo processes are needed to make vias through the planarization layer and to pattern the bottom electrode for the OLED. There is often another 1 to 2 photo process steps to construct a bank structure for full-color OLED processing (such as a well used to confine organic emitter ink when inkjet printing is used to pattern full-color emitter layers). Since the bulk conductivity of transparent top electrode (typically made of indium-tin-oxide or aluminum-zinc-oxide) is not sufficient for the common electrode to pass current from pixels to peripheral driver chips, another via is often needed and another metal bus line is thus needed on the backpanel. This design severely limits the aperture ratio of the top emission active matrix organic light emitting display products to ~50% range. Here "aperture ratio" means a ratio of emission zone over the sub-pixel pitch size. Moreover, depositing transparent metal oxide onto OLED layers is typically done by a sputtering process, retaining OLED performance (both power efficiency and operation lifetime) in top electrode process is one of the remaining challenges.

There is, thus, a strong interest in a bottom emission active matrix organic light emitting display architecture with sufficient aperture ratio for the OLED pad, and with low cost processes at least competitive to other display technologies, such as active matrix liquid crystal displays.

It would be highly advantageous, therefore, to remedy the foregoing and other deficiencies inherent in the prior art.

Accordingly, it is an object of the present invention to provide a new and improved active matrix organic light emitting display.

It is another object of the present invention to provide a new and improved active matrix organic light emitting display which is relatively simple and inexpensive to manufacture.

It is another object of the present invention to provide a new and improved active matrix organic light emitting display utilizing pixel control circuits with relatively uniform characteristics.

It is another object of the present invention to provide a new and improved active matrix organic light emitting display that can be constructed with relatively large areas.

It is another object of the present invention to provide a new and improved active matrix organic light emitting display with bottom emission and relatively high aperture ratio.

It is another object of the present invention to provide a new and improved active matrix organic light emitting display requiring low cost processes at least competitive to other display technologies.

It is another object of the present invention to provide a new and improved active matrix organic light emitting display with higher switch rate and higher frame rate beyond 60 Hz (higher carrier mobility in MO-TFT enables the frame rate to 120 Hz or beyond).

SUMMARY OF THE INVENTION

Briefly, to achieve the desired objects of the instant invention in accordance with a preferred embodiment thereof, provided is a full-color active matrix organic light emitting display including a transparent substrate, a color filter positioned on an upper surface of the substrate, a spacer layer formed on the upper surface of the color filter, a metal oxide thin film transistor backpanel formed on the spacer layer and defining an array of pixels, and an array of single color, organic light emitting devices formed on the backpanel and positioned to emit light downwardly through the backpanel, the spacer layer, the color filter, and the substrate in a full-color display.

The desired objects of the instant invention are further achieved in accordance with a preferred embodiment thereof in a method of fabricating a full-color active matrix organic light emitting display. The method includes a step of providing a transparent substrate formed of either glass, organic film, or a combination thereof and the substrate being either rigid or flexible. A color filter is positioned on an upper surface of the substrate and a spacer layer is deposited on the upper surface of the color filter. A metal oxide thin film transistor backpanel is formed on the spacer layer so as to define an array of pixels. An array of single color, organic light emitting devices is positioned on the backpanel to emit light downwardly through the backpanel, the spacer layer, the color filter, and the substrate in a full-color display.

The spacer layer and the materials of the backpanel are selected to be substantially transparent to light emitted by the organic light emitting devices and the result is an aperture ratio for each pixel of greater than 50%. The metal oxide used in the thin film transistors of the backpanel is preferably amorphous to substantially improve the repeatability, or uniformity, and the reliability of the thin film transistors over the entire array or matrix.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
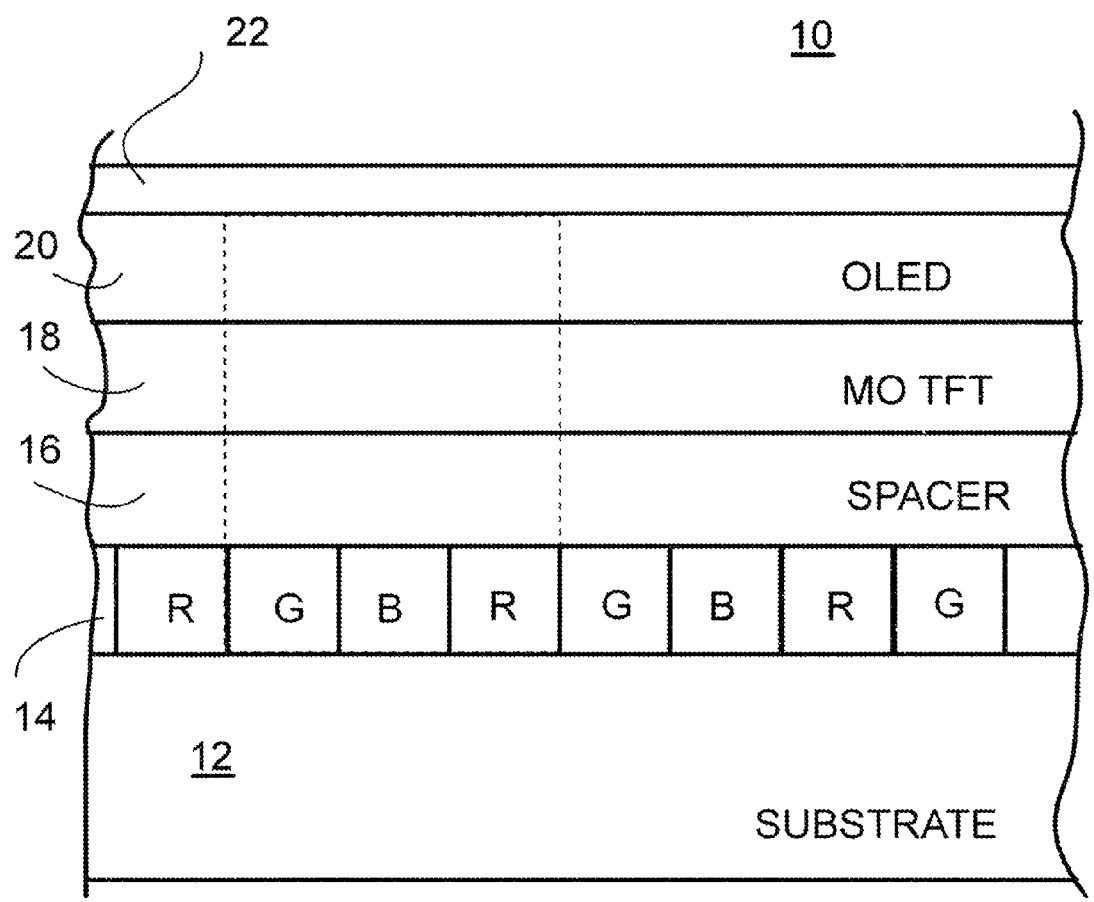
FIG. 1 is a simplified layer diagram of a display in accordance with the present invention.

Referring to FIG. 1, a simplified layer diagram of a display 10 in accordance with the present invention is illustrated. Display 10 includes a substrate 12 which in this embodiment is preferably glass but which could be any relatively rigid clear or transparent material, such as various plastics, etc. In the present context, the term "transparent" or "substantially transparent" is defined to mean material capable of optically transmitting light in the visible light range (400 nm to 700 nm) at greater than 70%. Further, it is intended that display 10 can be of a size similar to displays used in modern television, computer monitors, etc., i.e. relatively large area displays. A color filter 14 is deposited on the upper surface of substrate 12 and generally, includes plastic material with a relatively low heat tolerance, i.e. generally below 250° C. Color filter 14 is fabricated in three-color pixels (red, green, blue) in a well known fashion, i.e. each pixel includes three color elements, each of which is controllable to add a selected amount of each color to produce any selected ultimate or combined color in accordance with well known procedures.

A spacer layer 16 is deposited on the upper surface of color filter 14 which provides several functions including planarization of color filter 14 and a more compatible interface (i.e. layer 16 ensures a better match, both crystalline and energy layers, between materials at each interface. Because the various materials of color filter 14 are deposited in separate layers, planarization is preferred for a better surface for the deposition of the following components.

A metal oxide thin film transistor (MO TFT) layer 18 is formed on the upper surface of spacer layer 16. The metal oxide thin film transistors can be formed at relatively low temperatures (e.g. as low as room temperature) by processes such as physical vapor deposition, by a solution process including printing or coating, or by a surface chemical reaction. Printing includes any process such as ink jetting, dispensing, off-set printing, gravure printing, screen printing, etc. Coating includes any process such as slot coating, curtain coating, spray coating, etc. Physical vapor deposition includes any process such as sputtering, thermal deposition, e-beam deposition, etc. Surface chemical reaction includes surface reaction in gaseous or liquid environment.

In addition to planarization, spacer layer 16 provides heat protection for color filter 14 during fabrication of (MO TFT) layer 18. It has been found, for example, that annealing the metal oxide layer improves reliability and the characteristics of the transistors. This annealing procedure is performed by heating the gate metal of each of the transistors to over 300° C. with pulsed infra red energy. The heat from the gate metal anneals the metal oxide semiconductor adjacent the gate metal and spacer layer 16 protects the color filter from excessive heat (less than 250° C.). Additional information about this process can be found in a copending United States Patent Application entitled "Laser Annealing of Metal Oxide Semiconductor On Temperature Sensitive Substrate Formations", filed 21 May 2008, bearing Ser. No. 12/124,420, and included herein by reference. The metal oxide TFTs are formed in an amorphous metal oxide semiconductor, such as ZnO, InO, AlZnO, ZnInO, InAlZnO, InGaZnO, ZnSnO, GaSnO, InGaCuO, InCuO, AlCuO, etc. Here it should be understood that the term "amorphous" includes any semi-crystalline or non-crystalline metal oxide with grain size in the film plane significantly smaller than the TFT channel dimension. Because the amorphous metal oxide has small, standard grain size the characteristics of the TFTs formed in layer 18 are not substantially different from each other. Further, the metal oxide is transparent to light so that light can be transmitted downwardly through layer 18, layer 16, color filter 14 and substrate 12. Examples of materials that are preferable for spacer layer 16 include $SiO_2$, SiN, polyimide, BCB, or acrylic polymers.

The figure of merit in thin film transistors (TFTs) is defined by $\mu V/L^2$ where $\mu$ is the mobility, V is the voltage and L is the gate length. A major problem is partially remedied by the recent advance in metal oxide semiconductor materials in which mobility as high as 80 $cm^2$/V-sec has been demonstrated. One of the unique features of metal oxide semiconductors is that carrier mobility is less dependent on grain size of films, that is, high mobility amorphous metal oxide is possible. However, in order to achieve the high mobility required for high performance applications, the volume carrier density of the metal oxide channel should be high and the thickness of the metal oxide film should be small (e.g. <100 nm and preferably <50 nm). It has been found, however, that for these very thin channels, the interfacial interactions of the metal oxide with the underlying and overlaying material are no longer negligible.

The control of interfacial interactions can be implemented in either or both of two ways: (1) interaction with the underlying structure; and (2) interaction with the overlying structure. To fabricate TFTS, any or all of the following functions for the overlying and the underlying structures may be used. For example, different functions may be used on different portions or surfaces of a TFT. As examples of uses of the different functions, weak interaction can be used to adjust the threshold of the TFT and strong interactions are preferred for the good ohmic contacts in the source/drain regions. Some possible functions of overlying structures include: (1) passivation—provides weak or no interaction; (2) Gate—provides weak or no interaction; and (3) source/drain—provide strong interaction. Also, some possible functions of underlying structures include: (1) passivation—provides weak or no interaction; (2) Gate—provides weak or no interaction; and (3) source/drain—provide strong interaction. The functions of overlying and underlying structures needed for any specific embodiment of a TFT depends on the configuration of the TFT. Multiple functions may be needed for either the overlying or the underlying structure. Additional information on the control of interfacial interactions can be found in copending United States Patent Application entitled "Metal Oxide TFT with Improved Carrier Mobility", bearing Ser. No. 12/173, 995, filed on 16 Jul. 2008 and incorporated herein by reference.

A layer 20 of organic light emitting devices (OLEDS) is formed on the surface of MO TFT layer 18 so that light generated in OLED layer 20 is directed downwardly through MO TFT layer 18, spacer 16, color filter 14 and substrate 12. OLED layer 20 is also referred to as an OLED pad because it is usually formed as a complete unit. The metal oxide of layer 18 and spacer layer 16 are transparent to the light emitted from the OLEDs in layer 20. Because color filter 14 provides the desired color, the light emitted by the OLEDs of layer 20 is a single color, such as white. It will be understood however, that the OLEDs might be constructed to emit one or more of the primary colors (e.g. blue or blue-green) and the color filter then being used to separate the other two primary colors. In general, there are three types of color filters and associated light generators.

It is understood that in all full color displays a pixel includes three different color elements, red, green, and blue. Each color element has an associated organic light emitting device and the primary purpose is to fabricate OLEDs that are all of the same structure and that all emit the same color. The first type of color filter is referred to as a color absorbing type of filter. In the absorbing type of filter all three elements (red, green, and blue) of each pixel are color absorbing and the associated OLEDs generate white light. Thus, the red element absorbs all light except the red light, the green element absorbs all light except the green light, and the blue element absorbs all light except the blue light.

One problem with this type of color filter is that only approximately one third of the generated light is transmitted through the filter because of the color absorbing characteristics. To overcome some of the inefficiency, some color filters of this type include a fourth element in each pixel which simply allows the white light (in the present case, light generated by the OLEDs) to pass directly therethrough. This type of filter can be substantially more efficient since it is a well known fact that a substantial area of most views being displayed is either white or very close to white. Thus, mixing some white light with any or all of the red, green, and blue can substantially increase the efficiency of this type of filter.

The second type of color filter is one in which the associated OLEDs generate blue light. This is referred to as a color down-converting type of filter. In the down-converting type of color filter the blue light of each pixel is transmitted directly through the filter without alteration. In the green element, the blue light of each pixel is down-converted from blue to green. Basically, the blue light impinges on a material in the green element of the color filter, which material is energized to emit a green light. Similarly, in the red element, the blue light of each pixel is down-converted from blue to red. Basically, the blue light impinges on a material in the red element of the color filter, which material is energized to emit a red light.

The third type of color filter is one in which the associated OLEDs generate a blue-green light. This is referred to as a hybrid type of filter (i.e. both absorbing and down-converting). In the hybrid type of color filter the blue element of each pixel is a color absorbing element that absorbs all light (i.e. the green light) except the blue. The green element of each pixel is a color absorbing element that absorbs all light (i.e. the blue light) except the green. In the red element, the blue-green light of each pixel is down-converted from blue-green to red. Basically, the blue-green light impinges on a material in the red element of the color filter, which material is energized to emit a red light. This type of color filter also has a problem with efficiency because only approximately one third of the generated light is transmitted through the blue and green elements. To overcome some of the inefficiency as described above, some color filters of this type include a fourth element in each pixel which simply allows the white light to pass directly therethrough.

Thus, in this disclosure the term "full color" display is defined to mean a display in which the pixels include at least the three different color elements, red, green, and blue and in some specific applications a fourth clear or white element. In full color displays including the fourth clear or white element, light from an OLED passes directly through the color filter without substantial alteration.

It is important to understand that all of the OLEDs of layer 20 are of the same structure regardless of the type of color filter, so that no special process is required during fabrication. That is, each OLED of layer 20 generates similar light which is referred to herein as an array of single color, organic light emitting devices. Thus, all of the OLEDs can be formed using one common procedure without patterning the emission layer and manufacturing is substantially simplified. Elimination of patterning the emission layer with a shadow mask makes it possible to produce very large displays. Generally, a seal or protective coating 22 is formed over the entire structure to seal the OLEDs from the surrounding atmosphere, which can be detrimental to continued operation.

Thus, a display using low power, high output OLEDs can be manufactured relatively inexpensively. Further, with this invention it is possible to manufacture displays large enough to compete with present day television screens, computer monitors, etc., which relatively large displays were not possible using the prior art shadow mask process or the like. Also, it is known that OLEDs can be operated with relatively low power and they produce or generate relatively high amounts of light. Because the entire array of OLEDs incorporates a single type or color, preferably white, sky-blue, or blue, the manufacturing process is greatly simplified and actually makes manufacturing of relatively large displays possible.

The metal oxide thin film transistors used in backpanel 18 are deposited at low (e.g. room) temperature and require a minimum of operations. For example, MO TFT backpanel 18 can be manufactured using four photo masks and, if the compound semiconductor pattern is formed by a printing process (e.g. ink jetting, dispensing, off-set printing, gravure printing, screen printing, etc.), the backpanel can be completed with three photo masks. Further, the characteristics of the TFTs can be enhanced by annealing and control of interfacial interactions performed without overheating color filter 14 in accordance with the described procedures. The relatively high mobility of the metal oxide semiconductor material and the low leakage current (low OFF current) allows the use of small size storage capacitors, which can be overlaid with the power line to further increase space available for the emitter pad. The low leakage and simplified manufacturing techniques can be further enhanced by selectively anodizing the gate metal material at low temperature to form the gate dielectric at the transistor channel area and the capacitor area. In a preferred embodiment, an active matrix organic light emitting diode pixel driver (backpanel) was constructed with an aperture ratio larger than 50% and only the metal power lines are opaque to visible light so that the remaining area is used to define the emitter pad. In a specific embodiment the selection line, the data line and the power line were formed of opaque metal and used as a mask for pixel electrode formation. A transparent pixel electrode is deposited and patterned over the transparent area of each pixel or through a self-aligned patterning process from the back side. For 100 ppi, 85 µm by 255 µm sub-pixel area greater than an 80% aperture ratio was achieved.

In one example, the TFTs are made with Al as the gate electrode and AlO as the gate insulator. Indium-tin-oxide (ITO) is used as the source and drain electrodes. ZnO is sputtered and patterned over the channel and source/drain area. The width and the length of the channel were 200 µm and 20 µm, respectively. All the deposition and patterning processes were carried out without substrate or color filter heating. A post baking was carried out at 150° C. for 30 minutes. At least one TFT in each element had n-type characteristics, with ON current at 20V of approximately 0.5 mA and OFF current at −20V of a few picoamps. The ON/OFF ratio was over $10^7$ at 20V and the electron mobility was observed in a range of 5 $cm^2$/Vsec to 10 $cm^2$/Vsec. This example demonstrates the high mobility, high switch ratio TFTs that can be fabricated with amorphous metal oxide semiconductor material at low temperatures.

Figure 2:
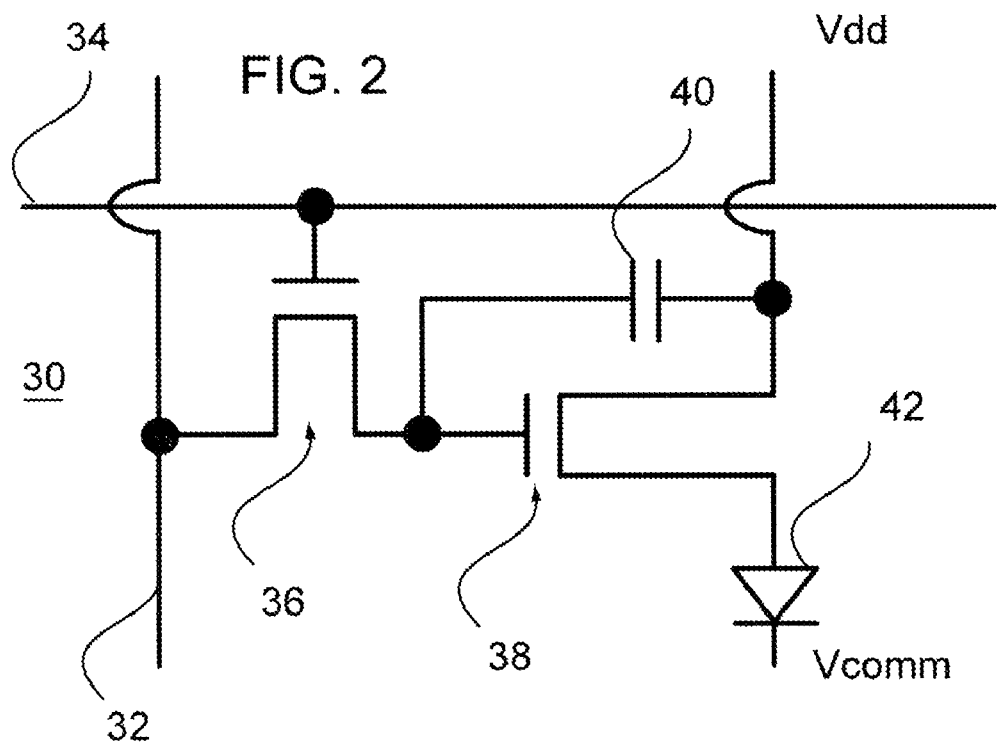
FIG. 2 is a circuit diagram of a single color element in accordance with the present invention.

Turning now to FIG. 2, a circuit diagram of a single color element, designated 30, in a pixel is illustrated. As will be understood from the disclosure, the two transistors, one capacitor, three bus line element 30 is possible because of the novel construction and the use of metal oxide semiconductor transistors. Pixel 30 is a common cathode arrangement wherein all of the cathodes of all of the elements in the array are connected to a common terminal or conductor. It will be understood that, three color elements similar to color element 30 are incorporated in each pixel to illuminate the red/green/blue colors for each pixel. As understood by those skilled in the art, a full color display incorporates an array of pixels generally oriented in rows and columns, with each pixel including three elements, each element in association with one of a red, green, or blue area of color filter 14.

Color element 30 is coupled between a data line 32 and a selection line 34. Each pixel in the column with element 30 is coupled to data line 32 and to a separate selection line 34. Similarly, each element in the row with element 30 is coupled to selection line 34 and to a different data line. Thus, by addressing data line 32 and selection line 34, pixel 30 is specifically selected. In a similar fashion each element in the array can be selected or addressed and the brightness controlled by a signal on the data line.

The control circuit of element 30 includes a switching transistor 36, a current regulator or driver transistor 38, and a storage capacitor 40. The gate of switching transistor 36 is connected to selection line 34 and the source-drain are connected between data line 32 and the gate of driver transistor 38. An OLED 42 that is being controlled by the control circuit has the cathode connected to the common terminal or conductor and the anode is connected through the source-drain of driver transistor 38 to a power source, Vdd. Storage capacitor 40 is connected between the power source, Vdd, and the gate of driver transistor 38.

Thus, when a select signal appears on selection line 34 and a data signal appears on data line 32, pixel 30 is addressed or selected. The signal on selection line 34 is applied to the gate of switching transistor 36, turning on the transistor. The data signal on data line 32 is applied through the source-drain of switching transistor 36 to the gate of driver transistor 38, turning driver transistor ON according to the amplitude and/or duration of the data signal. Driver transistor 38 then supplies power, generally in the form of driving current, to OLED 42, the brightness or intensity of light generated by OLED 42 depends upon the amount and/or duration of current supplied. Because of the efficiency of OLED 42 the driving current, i.e. the element current provided by driver transistor 38, is generally in a range of sub microampere to a few microamperes. Storage capacitor 40 memorizes the voltage on data line 32 after switching transistor 36 is turned off.

Figure 3:
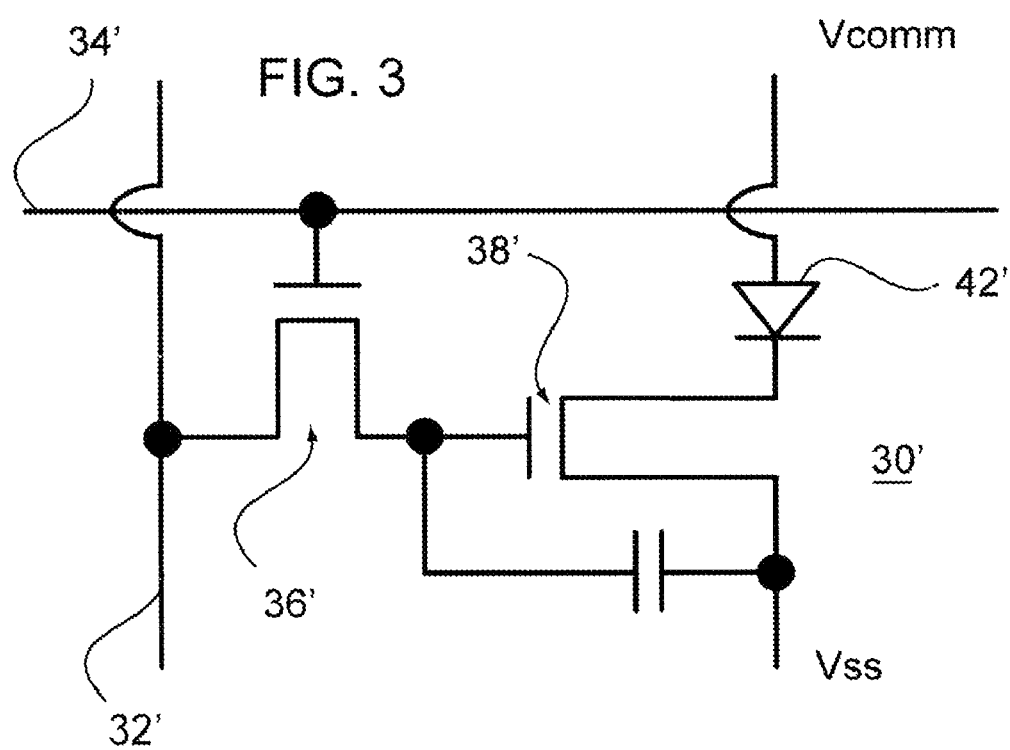
FIG. 3 is a circuit diagram of another embodiment of a single color element in accordance with the present invention.

Turning now to FIG. 3, a circuit diagram of another embodiment of a single color element, designated 30', in a pixel is illustrated. In this embodiment components similar to those in FIG. 2 are designated with similar numbers and a prime (') is added to each number to indicate the different embodiment. Pixel 30' is a common anode arrangement wherein all of the anodes of all of the elements in the array are connected to a common terminal or conductor. Color element 30' is coupled between a data line 32' and a selection line 34'. Each pixel in the column with element 30' is coupled to data line 32' and to a separate selection line 34'. Similarly, each element in the row with element 30' is coupled to selection line 34' and to a different data line. Thus, by addressing data line 32' and selection line 34', pixel 30' is specifically selected. In a similar fashion each element in the array can be selected or addressed and the brightness controlled by a signal on the data line.

The control circuit of element 30' includes a switching transistor 36', a current regulator or driver transistor 38', and a storage capacitor 40'. The gate of switching transistor 36' is connected to selection line 34' and the source-drain are connected between data line 32' and the gate of driver transistor 38'. An OLED 42' that is being controlled by the control circuit has the anode connected to the common terminal or conductor and the cathode is connected through the source-drain of driver transistor 38' to a power source, Vss. Storage capacitor 40' is connected between the power source, Vss, and the gate of driver transistor 38'.

Thus, a full-color active matrix organic light emitting display is disclosed that includes a transparent substrate, a color filter positioned on an upper surface of the substrate, a spacer layer formed on the upper surface of the color filter, a metal oxide thin film transistor backpanel formed on the spacer layer and defining an array of pixels, and an array of single color, organic light emitting devices formed on the backpanel and positioned to emit light downwardly through the backpanel, the spacer layer, the color filter, and the substrate in a full-color display. The combination of the color filter and the array of single color, organic light emitting devices allows the simplified manufacture of organic light emitting devices and, therefore the use of the devices. Also, the metal oxide thin film transistor backpanel allows the light to be transmitted down through the backpanel and the substrate to substantially increase the aperture ratio for a substantial reduction in pixel size (or improvement in light emission).

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A full-color active matrix organic light emitting display comprising:
   a transparent substrate;
   a color filter positioned on an upper surface of the substrate;
   a spacer layer formed on the upper surface of the color filter;
   a metal oxide thin film transistor backpanel formed on the spacer layer and defining an array of pixels; and
   an array of single color, organic light emitting devices formed on the backpanel and positioned to emit light downwardly through the backpanel, the spacer layer, the color filter, and the substrate in a full-color display.

2. A full-color active matrix organic light emitting display as claimed in claim 1 wherein the substrate is formed of one of glass, organic film, or a combination thereof.

3. A full-color active matrix organic light emitting display as claimed in claim 1 wherein the substrate is one of rigid or flexible.

4. A full-color active matrix organic light emitting display as claimed in claim 1 wherein the metal oxide thin film transistor backpanel includes a pixel element driving circuit for each color of each pixel in the array, each driving circuit comprising two transistors, a storage capacitor and three bus lines.

5. A full-color active matrix organic light emitting display as claimed in claim 4 wherein the two transistors in each driving circuit incorporate a semiconductor material selected from one of ZnO, InO, AlZnO, ZnInO, InAlZnO, InGaZnO, ZnSnO, GaSnO, InGaCuO, InCuO, and AlCuO.

6. A full-color active matrix organic light emitting display as claimed in claim 4 wherein the three bus lines include a selection bus for each row of pixels in the array and a data bus and power bus for each column of pixels in the array.

7. A full-color active matrix organic light emitting display as claimed in claim 6 wherein the two transistors in each pixel element include a switching transistor and a current regulating transistor, the switching transistor having a gate electrode connected to an associated selection bus and drain/source electrodes connected between an associated data bus and a gate electrode of the current regulating transistor, drain source electrodes of the current regulating transistor connecting the power bus to a terminal of an associated organic light emitting diode, and the storage capacitor connected between the power bus and the gate electrode of the current regulating transistor.

8. A full-color active matrix organic light emitting display as claimed in claim 4 wherein each pixel element driving circuit includes bottom gate TFTs so as to provide an aperture ratio of greater than 50%.

9. A full-color active matrix organic light emitting display as claimed in claim 1 wherein each organic light emitting device of the array of single color, organic light emitting devices generates similar light and the similar light includes one of white light, blue light, and blue-green light.

10. A full-color active matrix organic light emitting display as claimed in claim 9 wherein each organic light emitting device of the array of single color, organic light emitting devices generates one of white light, blue light, and blue-green light and the color filter includes one of an absorbing type color filter, a down-converting type color filter, and a hybrid type color filter, respectively.

11. A full-color active matrix organic light emitting display as claimed in claim 1 wherein the color filter, the metal oxide thin film transistor backpanel, and the array of organic light emitting devices are arranged into a plurality of pixels with each pixel including at least red, green, and blue elements.

12. A full-color active matrix organic light emitting display as claimed in claim 1 wherein the color filter, the metal oxide thin film transistor backpanel, and the array of organic light emitting devices are arranged into a plurality of pixels with each pixel including red, green, blue, and non-filtered white or blue-green elements.

13. A full-color active matrix organic light emitting display comprising:
   a transparent substrate formed of one of glass, organic film, or a combination thereof and one of rigid or flexible;
   a color filter positioned on an upper surface of the substrate;

a spacer layer formed on the upper surface of the color filter;

a metal oxide thin film transistor backpanel formed on the spacer layer and defining an array of pixels, the metal oxide thin film transistor backpanel including a pixel element driving circuit for each color of each pixel in the array, and each pixel element driving circuit including bottom gate TFTs; and an array of single color, organic light emitting devices formed on the backpanel and positioned to emit light downwardly through the backpanel, the spacer layer, the color filter, and the substrate in a full-color display, the materials in the spacer layer and the metal oxide thin film transistor backpanel are substantially transparent to light emitted from the array of organic light emitting devices, except for bus lines.

14. A full-color active matrix organic light emitting display as claimed in claim 13 wherein each pixel element driving circuit has an aperture ratio of greater than 50%.

15. A method of fabricating a full-color active matrix organic light emitting display comprising the steps of:

providing a transparent substrate formed of one of glass, organic film, or a combination thereof and one of rigid or flexible;

positioning a color filter on an upper surface of the substrate;

depositing a spacer layer on the upper surface of the color filter;

forming a metal oxide thin film transistor backpanel on the spacer layer and defining an array of pixels; and positioning an array of single color, organic light emitting devices on the backpanel to emit light downwardly through the backpanel, the spacer layer, the color filter, and the substrate in a full-color display.

16. A method as claimed in claim 15 wherein the step of depositing a spacer layer includes depositing a layer including one of $SiO_2$, SiN, polyimide, BCB, or acrylic polymers.

17. A method as claimed in claim 15 wherein the step of forming a metal oxide thin film transistor backpanel includes depositing an amorphous metal oxide semiconductor selected from one of ZnO, InO, AlZnO, ZnInO, InAlZnO, InGaZnO, ZnSnO, GaSnO, InGaCuO, InCuO, or AlCuO.

18. A method as claimed in claim 17 wherein the step of forming a metal oxide thin film transistor backpanel includes depositing the amorphous metal oxide semiconductor material by one of physical vapor deposition, by a solution process including printing or coating, or by a surface chemical reaction process.

19. A method as claimed in claim 15 including a step of selecting materials for the spacer layer and the metal oxide thin film transistor backpanel that are substantially transparent to light emitted by the array of single color, organic light emitting devices.

20. A full-color active matrix organic light emitting display comprising:

a transparent substrate formed of one of glass, organic film, or a combination thereof and one of rigid or flexible;

a color filter positioned on an upper surface of the substrate and designed to produce an array of pixels with each pixel including a portion that passes blue light, a portion that passes green light, and a portion that down-converts blue-green light to red light;

a spacer layer formed on the upper surface of the color filter;

a metal oxide thin film transistor backpanel formed on the spacer layer and defining an array of pixels, the metal oxide thin film transistor backpanel including a pixel element driving circuit for each color of each pixel in the array; and an array of organic light emitting devices each constructed to emit blue-green light, the array formed on the backpanel and positioned to emit light downwardly through the backpanel, the spacer layer, the color filter, and the substrate in a full-color display, the materials in the spacer layer and the metal oxide thin film transistor backpanel are substantially transparent to light emitted from the array of organic light emitting devices, except for bus lines.

21. A full-color active matrix organic light emitting display as claimed in claim 20 wherein transistors in each driving circuit incorporate a semiconductor material selected from one of ZnO, InO, AlZnO, ZnInO, InAlZnO, InGaZnO, ZnSnO, GaSnO, InGaCuO, InCuO, and AlCuO.

22. A full-color active matrix organic light emitting display as claimed in claim 20 wherein the selected semiconductor material is an amorphous material.

* * * * *